United States Patent
Jung et al.

(10) Patent No.: US 8,611,132 B2
(45) Date of Patent: Dec. 17, 2013

(54) SELF-BODY BIASING SENSING CIRCUIT FOR RESISTANCE-BASED MEMORIES

(75) Inventors: Seong-Ook Jung, Seoul (KR); Jisu Kim, Seoul (KR); Youngdon Jung, Seoul (KR); Jung Pill Kim, San Diego, CA (US); Seung H. Kang, San Diego, CA (US)

(73) Assignees: QUALCOMM Incorporated, San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 66 days.

(21) Appl. No.: 13/346,029

(22) Filed: Jan. 9, 2012

(65) Prior Publication Data

US 2012/0275212 A1 Nov. 1, 2012

Related U.S. Application Data

(60) Provisional application No. 61/481,044, filed on Apr. 29, 2011.

(51) Int. Cl.
*G11C 11/00* (2006.01)
*G11C 13/00* (2006.01)

(52) U.S. Cl.
CPC .................................. *G11C 13/0069* (2013.01)
USPC ................... 365/148; 365/210.1; 365/189.09; 365/203

(58) Field of Classification Search
CPC ................ G11C 11/56; G11C 13/004; G11C 2013/0054
USPC ........................... 365/148, 210.1, 189.09, 203
See application file for complete search history.

(56) References Cited

U.S. PATENT DOCUMENTS

| | | | |
|---|---|---|---|
| 6,185,143 B1 | 2/2001 | Perner et al. | |
| 6,839,269 B2 | 1/2005 | Iwata et al. | |
| 7,436,699 B2 | 10/2008 | Tanizaki et al. | |
| 7,791,931 B2 | 9/2010 | Chen et al. | |
| 2006/0067120 A1* | 3/2006 | Drebinger | 365/185.2 |
| 2008/0144367 A1 | 6/2008 | Dreesen et al. | |
| 2010/0054049 A1 | 3/2010 | Yamaoka et al. | |
| 2011/0090743 A1 | 4/2011 | Tran et al. | |

OTHER PUBLICATIONS

International Search Report and Written Opinion—PCT/US2012/035882—ISA/EPO—Sep. 5, 2012.

(Continued)

*Primary Examiner* — Thong Q Le
(74) *Attorney, Agent, or Firm* — Sam Talpalatsky; Nicholas J. Pauley; Joseph Agusta

(57) ABSTRACT

A resistance based memory sensing circuit has reference current transistors feeding a reference node and a read current transistor feeding a sense node, each transistor has a substrate body at a regular substrate voltage during a stand-by mode and biased during a sensing mode at a body bias voltage lower than the regular substrate voltage. In one option the body bias voltage is determined by a reference voltage on the reference node. The substrate body at the regular substrate voltage causes the transistors to have a regular threshold voltage, and the substrate body at the body bias voltage causes the transistors to have a sense mode threshold voltage, lower than the regular threshold voltage.

37 Claims, 5 Drawing Sheets

(56) References Cited

OTHER PUBLICATIONS

Lu S., "NML-MTJ interface sensing circuit designs and simulations", Nov. 12, 2009, XP002681965, Retrieved from the Internet: URL:http://www.cse.nd.edu/courses/cse40462/www/Public/2009/Proj_NML_CMOS_Interface.pdf [retrieved on Aug. 17, 2012].

Zhao, W. et al., "High Speed, High Stability and Low Power Sensing Amplifier for MTJ/CM0S Hybrid Logic Circuits", IEEE Transactions on Magnetics, Oct. 1, 2009, pp. 3784-3787, vol. 45, No. 10, IEEE Service Center, NY, US, XP011276943, ISSN: 0018-9464, DOI: 10.1109/TMAG.2009.2024325.

* cited by examiner

SELF-BODY BIASING SENSING CIRCUIT FOR RESISTANCE-BASED MEMORIES

CLAIM OF PRIORITY UNDER 35 U.S.C. §119

The present Application for Patent claims priority to Provisional Application No. 61/481,044 entitled "Self-Body Biasing Sensing Circuit for Resistance-Based Memories," filed Apr. 29, 2011, and assigned to the assignee hereof and hereby expressly incorporated by reference herein.

FIELD OF DISCLOSURE

The present disclosure relates to resistance memories and, more particularly, to resistance memory sensing circuits.

BACKGROUND

Magnetic resistance based memories are formed of individually accessible, switchable magnetic state elements. A common type of such element is the "magnetic tunneling junction" element (MTJ), having two stable magnetic states that are opposite from one another. Generally one of these two magnetic states is assigned to represent a binary "0" and the other assigned to represent a binary "1." The MTJ is switched into a desired one of the two magnetic states by passing a write current through it, with the direction of the write current being the independent variable that selects the magnetic state. The two magnetic states are termed "stable" because when switched into the state the MTJ will remain at that state for an extended period, without requiring power.

The MTJ can be used as a storage element because, as the term "magnetic resistance" describes, it has an electrical resistance uniquely corresponding to its magnetic state. The MTJ is therefore read by detecting its resistance. Generally, reading is performed by passing a read current through the MTJ and measuring the resulting voltage, generally termed a "sense" or "read" voltage. The read voltage is one of a high or low value, uniquely indicating which of the two magnetic states. The read voltage is then compared to a reference voltage, generally set at the midpoint between the low value and the high value. The output of the comparator therefore indicates, assuming no noise-related error, the magnetic state of the MTJ and therefore the information (e.g., a "0" or a "1") that it stored.

Specific types of MTJs and other types of magnetic resistance storage elements are known. Among these, spin transfer torque (STT) MTJs, or STT-MTJs, show particular promise. STT-MTJ, for example, has high read/write access speed, is compatible with metal oxide on silicon (MOS) processing, and has high read-write cycle endurance.

Although STT-MTJ (hereinafter referenced as "STJ") memory has been long known as promising, technical difficulties relating to processing yield and reliability (e.g., meeting and maintaining acceptable bit error rate, and/or access speed) have been long known as well, standing alone and in relation to, for example, power consumption and feature size. As one example, it is has been known that lowering the supply voltage (abbreviated hereinafter as "Vdd") may improve the reliability, and further, may decrease the power consumption of resistance-based memory. However, as described in greater detail below, it has also been long known that lowering Vdd can decrease processing yield.

As another example, it is been long known that stand-by leakage current, particularly in the current control transistors within the sensing circuits of the STJ memory, may contribute significantly to power consumption. This leakage related power consumption has been long known as particularly problematic in applications in which the STJ memory is often kept in a stand-by state—such as in a hand-held smart cellular telephone, remote monitoring station, and the like.

One conventional means for reducing this stand-by leakage current is to increase the threshold voltage ($V_{TH}$) of the sensing circuit current control transistors. Another conventional means is lowering the power supply voltage, in other words, lowering Vdd. However, both of these means can significantly reduce storage accuracy, i.e., reduce processing yield. One very significant reason is that both of the means reduce the sensing margin of the STJ sensing circuits. The sensing margin is the minimum difference between the read voltage (which is either a "0" or a "1" voltage) and the reference voltage against which the read voltage is compared by the sensing amplifier. Generally, for a given STJ memory the smaller the sensing margin the higher the susceptibility of the sensing amplifier to make an error and, therefore, the lower the processing yield.

Therefore, for these and other reasons a need has long existed in the STT-MTJ memory art, and other resistance-based memory arts, for increasing processing yield and lowering power consumption without incurring certain of the costs that may be associated with known means and methods.

SUMMARY

Methods and structures according to various exemplary embodiments provide, among other features, novel load transistor biasing for applications such as, but not limited to, sensing circuits for resistance-based memories that provide. These features, and others provided by various aspects of the exemplary embodiments can in turn provide, among other benefits and advantages, sensing circuit power reduction and improved maximization of read margin, and related benefits and advantages such as, but not limited to, increased processing yield.

According to one exemplary embodiment, a memory read circuit can comprise a reference node, a reference current control transistor having a source coupled to a terminal for receiving a power supply voltage, a drain coupled to the reference node, a body coupled to the drain, and a gate coupled to the reference node, and a read current control transistor having a source coupled to a terminal for receiving the power supply voltage, a drain, a body coupled to the drain of the reference current control transistor, and a gate coupled to the reference node.

In one aspect, the read current control transistor can be structured to have, in response to receiving an approximately zero volts body bias voltage between the source and the body of the read current control transistor, a threshold voltage $V_{TH0}$. In one further aspect, the reference current control transistor can be structured to have, in response to receiving an approximately zero volts body bias voltage between the source and the body of the reference current control transistor, a threshold voltage $V_{TH0}$.

In one aspect of one exemplary embodiment, the coupling of the drain of the reference current control transistor to the body of the reference current control transistor is configured to establish, in response to receiving the power supply voltage at the source of the reference current control transistor concurrent with a reference voltage on the drain of the reference current control transistor, a self-body bias voltage between the source and the body of the reference current control transistor. In one further aspect, the self-body bias voltage effects a change in the reference current control transistor threshold voltage from $V_{TH0}$ to $V_{TH}$, wherein $V_{TH}$ is lower than $V_{TH0}$.

One example memory read circuit according to one exemplary embodiment can comprise a reference node, a reference current control transistor having a source coupled to a terminal for receiving a power supply voltage of Vdd volts, a body, a drain coupled to the reference node, and a gate coupled to the reference node, a read current control transistor having a source coupled to a terminal for receiving the power supply voltage of Vdd volts, a drain, and a gate coupled to the reference node, and a body bias voltage generating circuit to convert the power supply voltage of Vdd volts to a body bias voltage and, in response to an operating condition, to couple the body bias voltage to the body of at least one of the read current control transistor or the reference current control transistor.

In one aspect, one example memory according to one exemplary embodiment can further include a pre-charge circuit to detect a stand-by condition and, in response, to precharge the body of at least one of the read current control transistor or the reference current control transistor. In one further aspect, wherein at least one of the read current control transistor or the reference current control transistor has a threshold voltage $V_{TH0}$ in response to the precharge. In an aspect, in response to the bias voltage, at least one of the read current control transistor or the reference current control transistor can have a threshold voltage $V_{TH}$, wherein $V_{TH}$ is lower than $V_{TH0}$.

One example method for reading a resistance memory having at least one read current control transistor having a body and at least one reference current control transistor having a body, can include, according to one exemplary embodiment: detecting a stand-by condition and, in response to detecting the stand-by condition, precharging at least one of the body of the read current control transistor or the body of one of the reference current transistors to a given power supply voltage (Vdd).

In one aspect, one example method according to the one exemplary embodiment can further comprise: detecting going off of the stand-by condition to an operating condition and, in response to the detecting going off of the stand-by condition to an operating condition, charging at least one of the body of the read current control transistor or the body of one the reference current transistors to a body biasing voltage lower than the given power supply voltage.

One exemplary embodiment can provide a body biasing apparatus for a resistance memory reading circuit having at least one read current control transistor having a body and at least one reference current control transistor having a body, the apparatus comprising, for example, means for detecting a stand-by condition, and means for precharging, in response to detecting the stand-by condition, at least one of the body of the read current control transistor or the body of one of the reference current transistors to a given power supply voltage (Vdd). In one aspect, an apparatus according to one exemplary embodiment can further include means for detecting going off of the stand-by condition to an operating condition, and means for charging, in response to said detecting, at least one of the body of the read current control transistor or the body of one the reference current transistors to a body biasing voltage lower than the given power supply voltage.

One example method for reading a resistance memory having at least one read current control transistor having a body and at least one reference current control transistor having a body, can include, according to one exemplary embodiment: step of detecting a stand-by condition and, in response to a result of said step of detecting the stand-by condition, precharging at least one of the body of the read current control transistor or the body of one of the reference current transistors to a given power supply voltage.

BRIEF DESCRIPTION OF THE DRAWINGS

The accompanying drawings are presented to aid in the description of exemplary embodiments of the invention and are provided solely for illustration of the embodiments and not limitation thereof.

DETAILED DESCRIPTION

Figure 1:
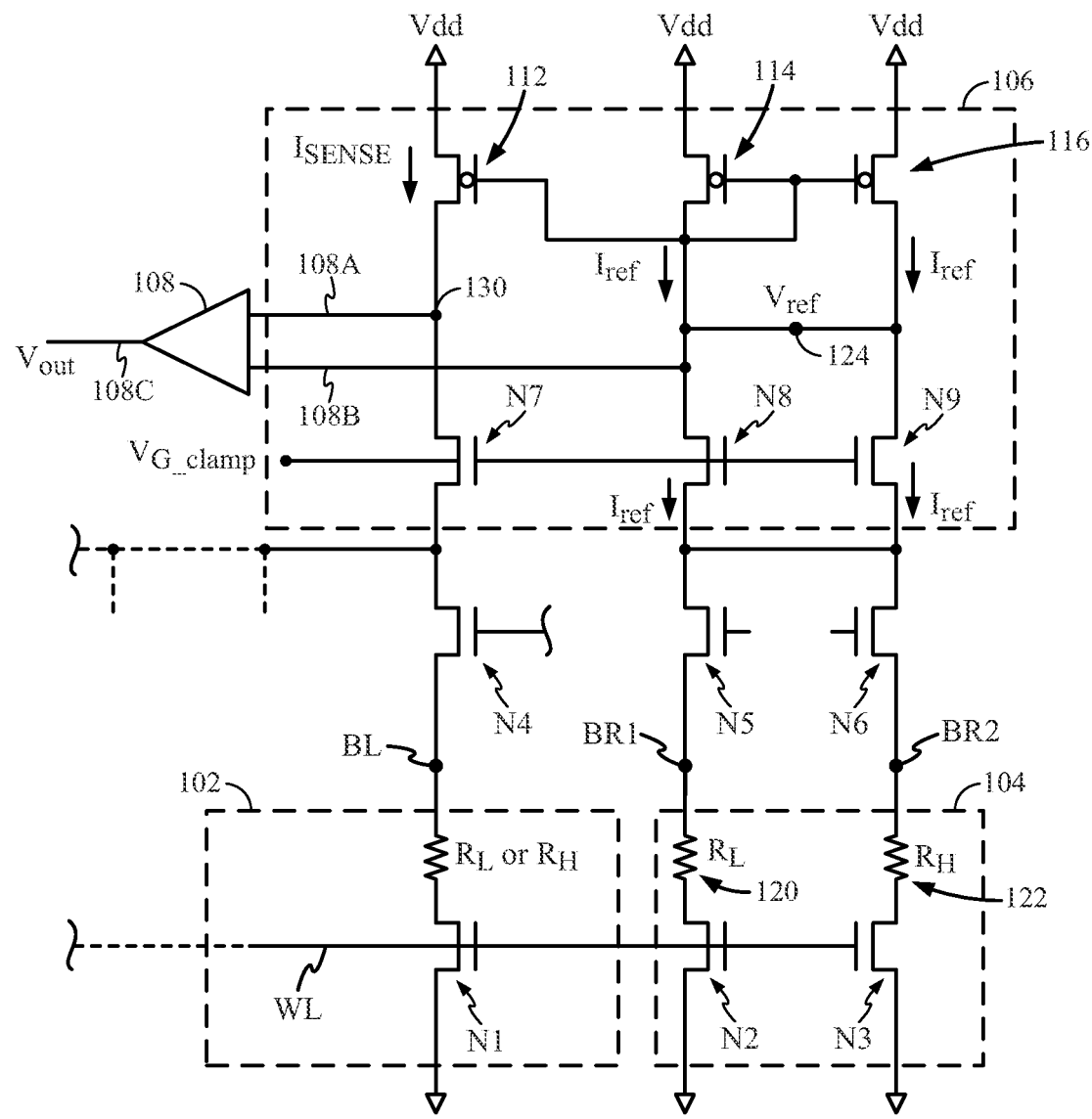
FIG. 1 is a simplified schematic diagram of a portion of a conventional MTJ memory, with a conventional sensing circuit.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Related Art FIG. 1 shows a simplified schematic of a portion of a conventional STJ memory, having an STJ memory cell 102, an associated STJ reference cell 104, a sensing circuit 106, and a sensing amplifier 108. Referring to FIG. 1, certain characteristics and operations will be described for purposes of context, and for purposes of background to assist in understanding advantages and aspects of the exemplary embodiments, as described in greater detail at later sections of this disclosure. It will be understood that this description referencing FIG. 1 may omit various characteristics, devices and operations that are not particular to, and/or are not necessary to be described for persons of ordinary skill in the art (referenced in the alternative as "artisans") to practice according to the embodiments. Further, with respect to specific structure for a conventional STJ memory corresponding to the FIG. 1 schematic, artisans can readily implement such a conventional STJ memory and, therefore, detailed description of conventional technologies and structures for such implementation are omitted, except where incidental to operations, or illustrative of features of one or more of the exemplary embodiments.

Referring now to FIG. 1, to read the magnetization state of the STJ memory cell 102, n-channel metal-oxide-semiconductor (NMOS) transistors N1-N6 are first switched ON. The switching is by particular control of bit line BL, reference bit lines BR1 and BR2, and word enable lines (shown but not separately labeled) coupled to the gates of N1-N6 (shown but not separately labeled) that are well-known to persons of ordinary skill in the art and, therefore, will not be described in detail. Clamp transistors N7-N9, driven by a clamp voltage $V_{G\_clamp}$ function to reduce unintended switching of the STL memory cell 102, as known in the art. Since N1-N6 are ON, a read current (hereinafter alternatively referred to as "sensing current") $I_{SENSE}$ passes from Vdd through the bit line through the sensing load p-channel metal-oxide-semiconductor (PMOS) 112 (hereinafter "sensing load PMOS" 112), then through N7, N4, through the STJ memory cell 102, then through N1 to ground. $I_{SENSE}$ is converted into a voltage $V_{SENSE}$ (not explicitly shown in the figures) on the sensing node 130 by multiplying the output resistance of the sensing load PMOS 112 by $I_{SENSE}$.

Continuing with description of an example read of the FIG. 1 STJ memory cell 102, the magnitude of $I_{SENSE}$, and hence the value of $V_{SENSE}$, depends on the magnetization state of the STJ memory cell 102, namely whether it is in a "0" or "1" state. As known to persons of ordinary skill in the art, the direction of the read current, $I_{SENSE}$, is opposite the write current direction for one of the "0" and "1" states. Therefore, $I_{SENSE}$ must be sufficiently small such that when reading STJ memory cell at the one of the "0" and "1" states it will not act as a write current that would reverse the state of the STJ memory cell 102 to the state for which the write current in the same direction as $I_{SENSE}$. This phenomenon is commonly referred to as a "read disturbance." In the FIG. 1 example sensing circuit, $I_{SENSE}$ read current direction is same as the write "0" current direction. Thus, the read disturbance does not occur when reading the STJ memory cell 102 in state "0" but can occur when reading the STJ memory cell 102 in state "1."

The terms "$I_{data0}$" and "$I_{data1}$" (not explicitly shown in the figures) will hereinafter refer to the value of $I_{SENSE}$ when the STJ memory cell 102 is in the "0" and the "1" storage state, respectively. The corresponding values of $V_{SENSE}$ on the sensing node 130 will be referred to as $V_0$ and $V_1$ (not explicitly shown in the figures). The sensing node 130 is coupled to input 108A of the sensing amplifier 108, and a reference voltage $V_{REF}$, described below in greater detail, on the reference node 124 is coupled to input 108B. The $V_{OUT}$ on 108C is either a "0" or "1" voltage depending on the comparative value of $V_{SENSE}$ and $V_{REF}$.

Referring still to FIG. 1, transistors N2, N3, N4 and N5, in combination with two reference current PMOS transistors, reference load PMOS 114 and reference load PMOS 116 (collectively referred to as "the reference load PMOS 114-116") provide a switchably enabled reference resistance path from the reference node 124 to ground.

For generation of $V_{REF}$, since N1-N6 are ON during the read operation, a reference current $I_{REF}$ flows from Vdd through the reference load PMOS 114-116, and through clamp transistors N8 and N9, through N5 and N6, through the reference STJ elements 120 and 122, through N2 and N3 to ground. The respective sources (shown but not separately numbered) of the reference load PMOS 114-116 are coupled to Vdd through respective terminals (shown but not separately numbered). By means known by persons of ordinary skill in the art, the reference STJ elements 120 and 122 are pre-written such that one is in a "0" state and the other in a "1" state. In the FIG. 1 example reference cell 104 it is arbitrarily assumed that the STJ element 120 was, as shown by its labeled resistance "$R_L$," pre-written into a "0" state and the reference STJ element 122 was as, shown by its labeled resistance "$R_H$," pre-written into a "1" state. Therefore, $I_{REF}$ flowing through the reference load PMOS 114-116, having their respective sources coupled, establishes $V_{REF}$ on the reference node 124, at a value that is nominally at midpoint between $V_0$ and $V_1$. This means of establishing $V_{REF}$ at the described midpoint voltage is well known to persons of ordinary skill in the art and, therefore, further detailed description is omitted. The difference between $V_0$ and $V_{REF}$ is hereinafter referred to as "$\Delta V_0$," and the difference between $V_1$ and $V_{REF}$ is hereinafter referred to as "$\Delta V_1$."

Referring still to FIG. 1 and continuing with description of an example read of the STJ memory cell 102, if $V_{REF}$ is exactly at the midpoint between $V_0$ and $V_1$ then $\Delta V_0$ will be equal $\Delta V_1$. However, for reasons such as process variation and temperature drift, the voltages $V_0$, $V_1$, and $V_{REF}$ vary from their nominal values. Therefore, one of $\Delta V_0$ and $\Delta V_1$ can be smaller than the other, and the magnitude of the smaller can be a significant driver in the error rate. More specifically stated, the probability of the sensing amplifier 108 making an error (i.e., the bit error rate) when comparing $V_{SENSE}$ to $V_{REF}$ is, in part, inversely related to the magnitude of $\Delta V_0$ and $\Delta V_1$. More particularly, assuming that a "0" and "1" have equal probability, the probability of the sensing amplifier 108 making an error will be substantially determined by the smaller of $\Delta V_0$ and $\Delta V_1$, that smaller value being known to artisans as the "sensing-margin." As also known to such persons, with respect to the error rate of the sensing amplifier 108 in a convention sensing circuit 106, when the sensing margin decreases the error rate increases and, therefore, the processing yield decreases.

Long known technical difficulties relating to conventional means for reducing power in conventional STJ memory, in particular the inherent cost incurred by such means in terms of reducing the sensing margin, will now be described.

One metric of processing yield for STJ memory is based on maximum acceptable bit error rate (e.g., the maximum acceptable error rate of the sensing amplifier 108) and is termed the "read access pass yield" or "RAPY." Before describing a relation between RAPY and certain known techniques of reducing power consumption in conventional STJ sensing circuits, and without being bound to a particular theory, example statistical models of RAPY will be introduced. It will be understood, though, by persons of ordinary skill in the art that knowledge of RAPY, and knowledge of these statistical models of RAPY are not necessary to practice according to the exemplary embodiments. Without being bound to a particular theory, it is believed, though, that these described example statistical models, and alternative forms of these models that may become apparent to artisans from this disclosure, will illustrate advantages provided by the various exemplary embodiments.

Without being bound to a particular theory, RAPY can be modeled based on the respective mean and variance of two parameters, these being $\Delta V_0$ and $\Delta V_1$, and the offset voltage of the sensing amplifier 108, termed "$V_{SA\_OS}$," (not explicitly shown in the figures). As will be understood by artisans having view of this disclosure, assuming a sufficiently large sample set the probability density function for $\Delta V_0$ and $\Delta V_1$ and for the $V_{SA\_OS}$ can be reasonably assumed as Gaussian. Since RAPY is generally defined as a "pass/fail" metric, a pass/fail criterion based on model parameters can be selected. For purposes of example, the read access pass/fail criterion can be: when $\Delta V_0$ (and $\Delta V_1$) is larger than $V_{SA\_OS}$ the read access passes. This pass/fail criterion is only one example, not a limitation. For example, a pass/fail criterion of $\Delta V_0$ (and $\Delta V_1$) being larger than $V_{SA\_OS}$ by a given amount X could be used. Artisans can readily adapt the statistical modeling described in this disclosure to reflect such a criterion.

Based on the above-described example assumptions, the RAPY in sigma for one STJ bitcell, e.g., the STJ memory cell 102, can be referenced as "$RAPY_{CELL}$" and can be represented as:

$$RAPY_{CELL0} = \frac{\mu_{\Delta V0} - \mu_{SA\_OS}}{\sqrt{\sigma_{\Delta V0}^2 + \sigma_{SA\_OS}^2}} \quad (1A)$$

$$RAPY_{CELL1} = \frac{\mu_{\Delta V1} - \mu_{SA\_OS}}{\sqrt{\sigma_{\Delta V1}^2 + \sigma_{SA\_OS}^2}} \quad (1B)$$

and $$RAPY_{CELL} = \min(RAPY_{CELL0}, RAPY_{CELL1}), \quad (2)$$

where $\mu_{\Delta V0}$ is the mean of $\Delta V_0$, $\mu_{\Delta V1}$ is the mean of $\Delta V_1$, and $\mu_{SA\_OS}$ is the mean of $V_{SA\_OS}$, and where $\sigma_{\Delta V0}$, $\sigma_{\Delta V1}$, and $\sigma_{SA\_OA}$ are the standard deviation $\Delta V_0$, $\Delta V_1$ and $\sigma_{SA\_OS}$, respectively.

Continuing with the above description of an example statistical model for RAPY, the magnitude of $I_{SENSE}$ must, as previously described, be below a certain level to avoid a read operation causing unintended switching of the STJ element's (e.g., STJ memory cell 102) magnetic state. On the other hand, as known to artisans the greater the magnitude of $I_{SENSE}$ the greater is each of $\Delta V_0$ and $\Delta V_1$ and hence, subject to $V_{REF}$, the greater the potential sensing margin. Therefore, in designing a circuit according to the FIG. 1 conventional sensing circuit 106 a compromise magnitude of $I_{SENSE}$ may be required, the compromise providing a $\Delta V_0$ and $\Delta V_1$ that, together with the selected $V_{REF}$ and $V_{TH}$, obtains an acceptable rate of unintended switching. This unintended switching, essentially changing an STJ memory cell in the process of reading, may, as previously described, be referred to as a "read disturbance." The related metric for the yield of STJ memories may be termed "read disturbance pass yield" or "RDPY." Without being bound to particular theory, assuming a sufficiently large sample set, a Gaussian distribution for $I_{SENSE}$ can be assumed, and RDPY in sigma for one bitcell (e.g., STJ memory cell 102), which will be termed "$RDPY_{CELL}$" can be expressed as:

$$RDPY_{CELL} = \frac{\mu_{I_{C+}} - \mu_{data1}}{\sqrt{\sigma_{I_{C+}}^2 + \sigma_{Idata1}^2}} \quad (3)$$

where $I_C^+$ (not explicitly shown in the figures) is the current required to switch the STJ memory cell (e.g., STJ memory cell 102) from a "1" state to a "0" state, ($\mu_{Ic+}$) is the mean of $I_C^+$, $\mu_{1data1}$ is the mean of $I_{data1}$, and $\sigma_{1data1}$ and $\sigma_{Ic+}$ are the standard deviation of $I_{data1}$ and $I_{C+}$, respectively.

Without being bound to a particular theory, $RAPY_{CELL}$, which is defined above at Equation (2) and $RDPY_{CELL}$, which is defined at Equation (3), both being expressed in sigma, can each be converted into a probability using, for example:

$$P_{RAPY\_CELL} = \Phi(RAPY_{CELL}) \quad (4)$$

$$P_{RDPY\_CELL} = \Phi(RDPY_{CELL}) \quad (5)$$

where $\Phi(x)$ is the cumulative distribution function (CDF) of the normalized Gaussian random variable x, with x being $RAPY_{CELL}$ or $RDPY_{CELL}$.

Referring now to FIG. 1, certain conflicting considerations that go into selecting $V_{TH}$ for the sensing load PMOS 112, the reference load PMOS 114 and the reference load PMOS 116 in the conventional sensing circuit 106 will be described. For brevity, the sensing load PMOS 112, the reference load PMOS 114 and the reference load PMOS 116 will be collectively referenced as "the load PMOS 112-116."

As shown in FIG. 1, in the conventional sensing circuit 106 $V_{REF}$ is coupled to the gates of the load PMOS 112-116. $V_{TH}$ therefore inherently places a limit on $V_{REF}$. This limit is that $V_{REF}$ cannot be greater than (Vdd−|$V_{TH}$|), because if this limit is exceeded the load PMOS 112-116 will switch off. One convention means for lowering power consumption in conventional sensing circuit 106 is to use low-leakage transistors. However, low-leakage PMOS transistors typically possess a higher $V_{TH}$ than high-performance PMOS transistors. Therefore, since $V_{REF}$ cannot be greater than (Vdd−|$V_{TH}$|), using low leakage PMOS transistors for the load PMOS 112-116 in the conventional sensing circuit 106 places a lower limit on $V_{REF}$ than available with lower $V_{TH}$ high-performance PMOS load transistors. The lower $V_{REF}$, in turn, in the conventional sensing circuit 106 can reduce the sensing margin, thereby making sensing more difficult and decreasing RAPY. This is one example of opposing considerations inherent in selecting $V_{TH}$ for the reference load PMOS 114-116 in the conventional sensing circuit 106, namely between optimizing $V_{TH}$ with respect to leakage and access rate, and optimizing $V_{REF}$ for RAPY.

One attempt to solve, in part, the above-described reduction in sensing margin that can result from using low-leakage (higher $V_{TH}$) reference load PMOS 114-116 in the conventional sensing circuit 106 is to use fixed-gate-voltage load PMOS load transistors (not shown), instead of $V_{REF}$ coupling to the gates of the PMOS load transistors such as shown in FIG. 1. However, the use of fixed-gate-voltage load PMOS load transistors in the mirror-type circuit employed by the FIG. 1 conventional sensing circuit 106 can yield unfavorable results. Stated more particularly, fixed-gate-voltage load PMOS load transistors can be much more vulnerable to process variation, in the mirror-type circuit arrangement employed by the FIG. 1 conventional sensing circuit 106, than the $V_{REF}$ gate voltage applied to the load PMOS 112-116. A reason, without being bound to a particular theory, and assuming the load PMOS 112-116 have a standard form current-voltage (I-V) curve (not shown), and further assuming the well-known "process-voltage-temperature" (PVT) model, is that a variation in the "P" for the fixed-gate-voltage load PMOS transistors can cause a significant mismatch between the saturation currents of the clamp NMOS transistors (e.g., N7, N8 and N9) and the load PMOS transistors. Accordingly, the operating point of the sensing current $I_{SENSE}$ cannot be determined to the point where the sensing-margin is optimized; thus, the sensing failures increase. Phrased differently, RAPY decreases.

Figure 2:
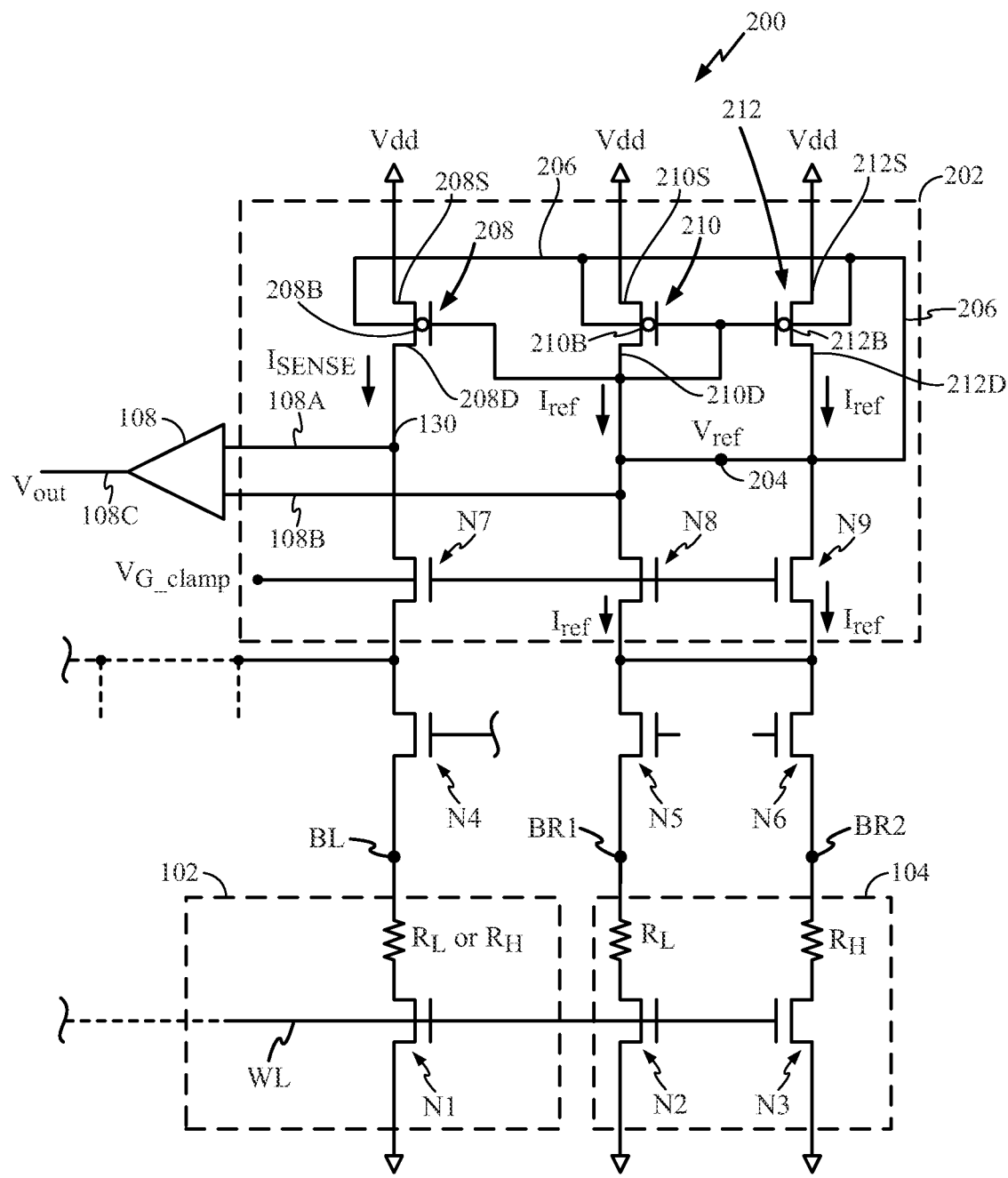
FIG. 2 shows a schematic diagram of one example self-body biased load transistor sensing circuit according to various exemplary embodiments.

Turning now to FIG. 2, shown is a simplified schematic of one example self-body biasing sensing circuit 202 according to one or more exemplary embodiments. The example self-body biasing sensing circuit 202 is shown in an example environment 200 to assist in describing example operations. To further focus on the novel aspects of the exemplary embodiments, and to avoid introduction of details not particular to the embodiments, the FIG. 2 environment 200 is the FIG. 1 conventional STJ memory portion with the conventional sensing circuit 106 replaced by the example self-body biasing sensing circuit 202 according to one exemplary embodiment. However, as will be readily apparent to persons of ordinary skill art from reading this disclosure, the FIG. 2 depicted environment or application 200 is not intended as a limitation on the scope of structures or methods contemplated by the exemplary embodiments.

Referring to FIG. 2 and to its example self-body biasing sensing circuit 202 according to various exemplary embodiments, $V_{REF}$ on the reference node 204 is established in a manner that, to an extent, is comparable to generation of $V_{REF}$ in the sensing circuit 106 of FIG. 1. More particularly, as per conventional reference circuit design, the PMOS load transistor 210 and the PMOS load transistor 212 have their respective sources 210S and 212S coupled via terminals (shown but not separately numbered) to Vdd, and their respective drains 210D and 212D coupled to the reference node 204. The gates (shown but not separately numbered) of the PMOS load transistors 210 and 212 couple to the drain 210D of the PMOS load transistor, thereby providing for an $I_{REF}$ to pass through the reference bit lines BR1 and BR2, as previously described. In contrast, and in addition, though, referring still to the FIG. 2 simplified schematic, in an aspect of at least one exemplary embodiment that is shown by the self-body biasing sensing circuit 202, self-body biasing of the reference load PMOS 210 is provided. The self-body biasing of the reference load PMOS 210 is provided by a connection or coupling 206, preferably a low resistance coupling, of the drain 210D of the reference load PMOS 210 to the body 210B of that reference load PMOS 210, and the self-body biasing of the reference load PMOS 212 is provided by a connection or coupling (represented in FIG. 2 by the same graphics as the previously described coupling 206), preferably a low resistance coupling, of the drain 212D of the reference load PMOS 212 to the body 212B of that reference load PMOS 212. Therefore, in accordance with various exemplary embodiments the reference current control transistors providing $I_{REF}$ to the reference bits lines BR1, i.e., the bodies 210B and 212B of the reference load PMOS 210 and 212, are self-body biased at $V_{REF}$ by the reference load PMOS 210 and 212 drains 210D and 212D, respectively, which provide the $V_{REF}$ voltage. In an aspect, the PMOS 210 and 212 drains 210D and 212D, respectively, are coupled to the body 208B of a sensing self-body biased load PMOS 208. The source 208S of the sensing self-body biased load PMOS 208 is coupled via a terminal (shown but not separately numbered) to Vdd, and its drain 208D is coupled to the previously conventional sensing node 130 connected, in turn, to the sensing amplifier input 108A. For brevity, the phrase "the self-biased load PMOS 208/210/ 212" will be used as a collective reference to the sensing self-body biased PMOS transistor 208 and the first and second reference self-body biased load PMOS 210 and 212.

In overview, as will be described in greater detail below, the FIG. 2 example self-body biasing sensing circuit 202 according to various exemplary embodiments provides, among other features and benefits, automatic lowering $V_{TH}$ for the self-biased load PMOS 208/210/212 during the sensing operation, followed by automatic return of their $V_{TH}$ to their original $V_{TH}$ value (referred to as $V_{TH0}$) after the sensing operation, thus further providing an increase of sensing margin, and increase of RAPY.

Further and equally significant among the features and benefits provided by the self-body biasing sensing circuit 202 according to various exemplary embodiments is that the automatic lowering and raising of $V_{TH}$ for the self-biased load PMOS 208/210/212, provides the increased sensing margin without the power consumption cost due to leakage current as can be incurred by using low $V_{TH}$ load PMOS 112-116 in the conventional sensing circuit 106, as previously described.

Still further among the features and benefits provided by the self-body biasing sensing circuit 202 according to various exemplary embodiments is significant reduction in power consumption during stand-by mode or condition. The significant reduction in power is obtained by the exemplary embodiments' feature of higher $V_{TH}$ during stand-by without the cost in reduced sensing margin and slower access that can be incurred by using higher $V_{TH}$ load PMOS 112-116 in the conventional sensing circuit 106, as previously described.

Therefore, as will be appreciated by persons of ordinary skill in the art from this disclosure, sensing circuits according to various exemplary embodiments, for example the self-body biasing sensing circuit 202, can provide a substantially larger sensing-margin, and hence increased processing yield with an insignificant leakage current overhead. In addition the exemplary embodiment can provide further power reduction during stand-by, without decrease in processing yield or sensing margin.

In overview, without being bound to a particular theory of operation of any of the exemplary embodiments, or of any aspect of any embodiment, it is believed that the source-body bias voltage $V_{SB}$ effected by coupling of $V_{REF}$ to the bodies 208B, 210B, 212B of the body-self biased PMOS load 208/210/212 changes $V_{TH}$ according to the model below:

$$V_{TH}=V_{TH0}+\gamma(\sqrt{|-2\Phi_F+V_{SB}|}-\sqrt{|-2\Phi|}) \quad (6)$$

where $V_{TH0}$ is the threshold voltage for $V_{SB}=0$, $\gamma$ is the body-effect coefficient (which is negative for PMOS), $\Phi$ is the voltage across the depletion layer, and $V_{SB}$ is the voltage difference between the source and the body. Persons of ordinary skill in the art have knowledge of $\gamma$, the body-effect coefficient, and $\Phi$, the voltage across the depletion layer and, therefore further detailed description of these is omitted.

Referring to FIG. 2, in the example self-body biasing sensing circuit 202 according to various exemplary embodiments, the $V_{REF}$ body voltage on the self-body biased load PMOS 208/210/212 establishes $V_{SB}$ of (Vdd–|$V_{REF}$|) for each. Referring to Equation (7), since $V_{TH}$ and $V_{TH0}$ are negative for PMOS the resulting increased $V_{SB}$ compared to the $V_{SB}$ of approximately zero (0) volts for PMOS load transistors in the conventional sensing circuit 106, obtains a decrease in the threshold voltage from $V_{TH0}$ to $V_{TH}$. This in turn increases the maximum value of $V_{REF}$ because, referring to the gate-to-source voltage of each of the body-self biased load PMOS 208/210/212 resulting from $V_{REF}$ on their respective gates, $V_{REF}$ cannot be greater than (Vdd–|$V_{TH}$|). The lower $V_{TH}$ of the body-self biased load PMOS 208/210/212 provided by this example of self-body biasing according to the various embodiments, can allow $V_{REF}$ to reach its target value without being prevented by the above-described limit of (Vdd–|$V_{TH}$|). Phrased differently, and as will be readily appreciated by persons of ordinary skill in the art in view of this disclosure, this $V_{TH}$ lowering feature provides a larger sensing-margin during the sensing operation, therefore lower error rate by the sensing amplifier 108, and hence can provide significant increase in RAPY and RDPY.

Referring to FIG. 2, another of the features and benefits provided by self-body biasing sensing circuits according to various exemplary embodiments is that $V_{TH}$ is decreased from $V_{TH0}$ only during a read operation. At other times, for example during stand-by mode, $V_{TH}$ is at its $V_{TH0}$ value. Described further, during stand-by mode the NMOS transistors N1-N6 are off. The voltage on the reference node 204 is therefore at approximately Vdd. This changes $V_{SB}$ to approximately 0 volts, which in turn reverts $V_{TH}$ to the higher $V_{TH0}$ value as shown in Equation (6). Leakage of the self-body biased load PMOS 208/210/212 during stand-by is therefore significantly reduced.

As can be readily appreciated by persons of ordinary skill in the art from this disclosure, self-body biasing sensing circuits according to the exemplary embodiments, by automatically decreasing $V_{TH}$ during sensing operations, and automatically reverting $V_{TH}$ to the nominal or regular value during standby, obtains concurrently the benefit of a low $V_{TH}$, and of a high $V_{TH}$, without the costs previously described that either incurs if used for the load PMOS 112-116 in the conventional sensing circuit 106.

Selecting a target value for $V_{REF}$ in a self-body biasing sensing circuit according to various exemplary embodiments, for example $V_{REF}$ on the reference node 204 of the FIG. 2 self-body biasing sensing circuit 202, will now be described. As will be apparent to persons of ordinary skill in the art from reading this disclosure, the body voltage for the optimal $V_{TH}$ and $V_{REF}$ to maximize RAPY$_{CELL}$ may not be identical. Accordingly, it may seem, at first, to such persons to be difficult to optimize RAPY$_{CELL}$ and the leakage current in the self-body biasing sensing circuit. However, as previously described, $V_{REF}$ must be approximately one-half of Vdd, i.e., Vdd/2, to maximize the sensing-margin. Therefore, applying this Vdd/2 value to the body of the load PMOS can sufficiently reduce $V_{TH}$ to the required value to enhance RAPY$_{CELL}$. Moreover, the leakage current does not significantly increase even if $V_{REF}$ is reduced to around Vdd/2. Therefore, in practicing a self-body biasing circuit according to various exemplary embodiments, such as the FIG. 2 example self-body biasing sensing circuit 202, setting $V_{TH}$ to Vdd/2 can provide both a sufficiently high RAPY$_{CELL}$ and a small leakage current.

Referring to the FIG. 2 example self-body biasing circuit 202, setting $V_{REF}$ to Vdd/2 maximizes the sensing margin at the inputs 108A and 108B of the sensing amplifier 108. Further, during a reading operation the example self-body biasing circuit 202 applies, according to one aspect, the $V_{REF}$ of Vdd/2 to the respective body (208B, 210B, 212B) of each of the self-body biased PMOS load transistors 208/210/212. Referring to Equation (6), $V_{TH}$ is therefore significantly reduced during the read operation thereby obtaining, for example, a higher access rate. After the read operation, N1-N6 are switched OFF, reverting $V_{TH}$ to its nominal value, thereby avoiding the stand-by leakage current and associated power consumption of low $V_{TH}$ self-body biased PMOS load transistors 208/210/212 and, instead, obtaining through the stand-by duration the benefit of high $V_{TH}$ self-body biased PMOS load transistors 208/210/212.

Design rules (e.g., cell layout rules) and technology considerations for implementing a circuit according to the exemplary embodiments are not particular to these embodiments except that selecting, for example among different devices in a standard cell library, for devices to implement self-body biased load PMOS 208/210/212 may include particular consideration of the strength of the body effect of different devices that may be available. In one aspect described in greater detail below, an input/output (IO) device, selection of which to use as PMOS load transistors is counter to conventional design methodology, may be used for a novel employment of their stronger body effect than non-IO, or "core" devices.

Referring to the FIG. 1 in the conventional sensing circuit 106 process variation of the load PMOS transistors can have the largest effect on the sensing-margin variation. Overcoming the effects of the process variation requires a particular circuit technique. Without being bound to a particular theory, the process variation can be modeled as:

$$\sigma_{V_{TH}} \propto \frac{A_{VT}}{\sqrt{W \cdot L}} \quad (7)$$

where $A_{VT}$ is the Pelgrom coefficient and is determined by the process technology, and W and L are the width and length, respectively, of the load PMOS transistors. Discussion of the Pelgrom coefficient and its relation to process technology is not necessary for understanding the concepts of, or for practicing according to the exemplary embodiments and, therefore, further detailed description is omitted.

Without being bound to a particular theory, it is believed for a given value of Vdd there exists a magnitude of $I_{SENSE}$ for which the load PMOS transistors can be designed that is optimal in terms of maximizing $RAPY_{CELL}$. Referring to Equation (7) above, it seen increasing L and W reduces the sigma (standard deviation) of $V_{TH}$. However, increasing L and W increases the layout area of the PMOS load transistor. Thus, the tradeoff between the area and $RAPY_{CELL}$ needs to be considered when determining the transistor length L.

Figure 3:
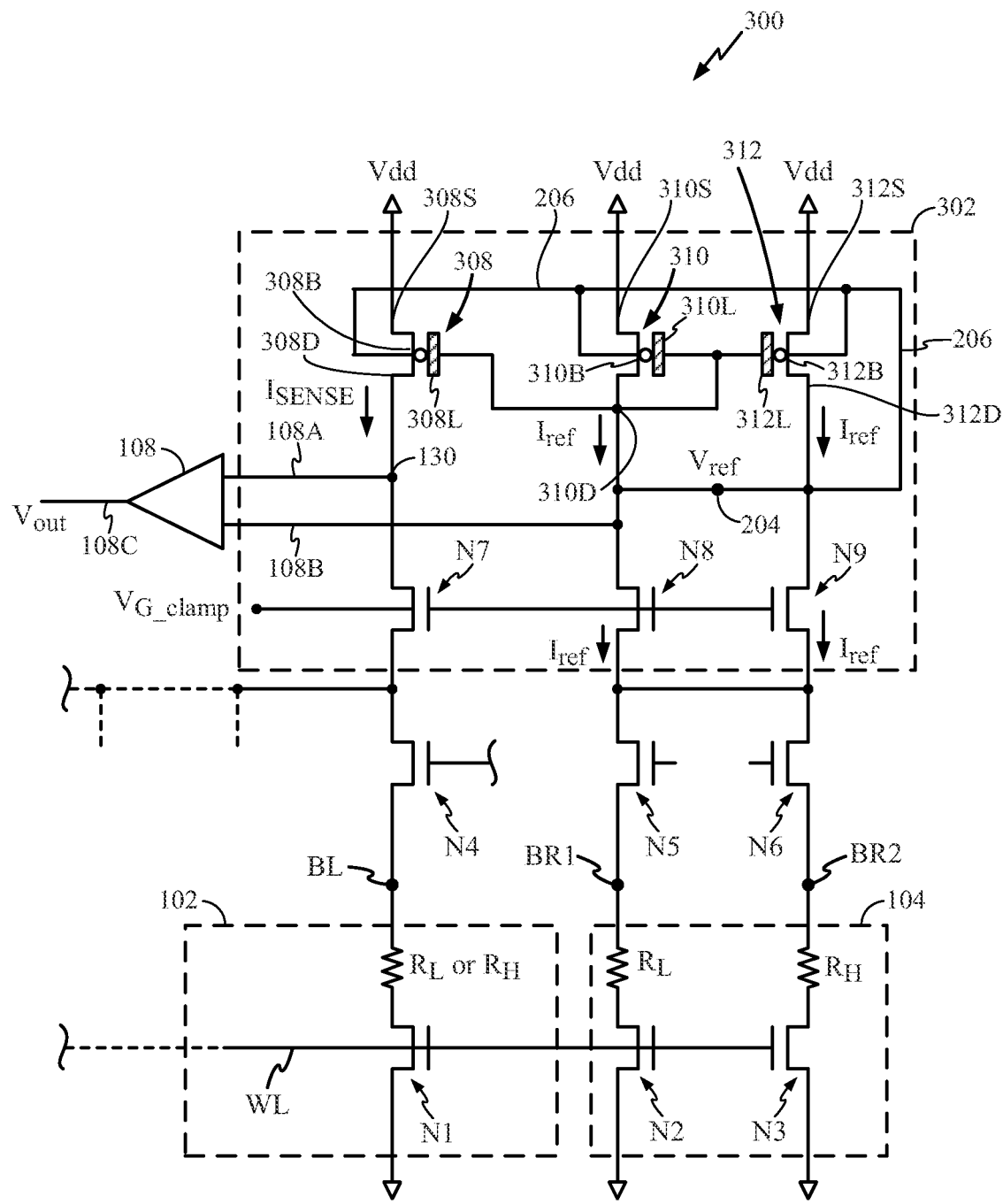
FIG. 3 shows a schematic diagram of one example of self-body biased load transistor sensing circuit, having one long channel aspect, according to various exemplary embodiments.

FIG. 3 shows a schematic diagram of one example self-body biased load transistor sensing circuit 302 according to another exemplary embodiment in an example environment 300 that can be identical to the environment 200 of FIG. 2. In one aspect the self-body biased load transistor sensing circuit 302 includes longer channel IO PMOS load transistors replacing the self-body biased load PMOS 208-212 of the FIG. 2 self-body biased sensing circuit 202, with the long channel self-body biased sensing load PMOS 308, long channel self-body biased reference load PMOS 310, and long channel self-body biased reference load PMOS 312, collectively referenced as "long channel self-body biased load PMOS 308-312." The channels of the long channel self-body biased load PMOS 308-312 are shown on FIG. 3 as 308L, 310L, and 312L, respectively. Referring to FIG. 3, the long channel self-body biased sensing load PMOS 308 has a source 308S coupled to Vdd, a body 308B, and a drain 308D that is coupled to the input 108A of the previously described sense amplifier 108. The long channel self-body biased reference load PMOS 310 has a body 310B, a source 310S that is coupled to Vdd, and a drain 310D coupled to the reference node 204. The long channel self-body biased reference load PMOS 312 similarly has a body 312B, a source 312S that is coupled to Vdd, and a drain 312D coupled to the reference node 204. The coupling 206 of the drain 312D and the body 312B of the self-body biased reference load PMOS 312, and the coupling 206 of the of the drain 310D and the body 310B of the self-body biased reference load PMOS 310 provide the self-body biasing as previously described.

In one aspect, the long channel self-body biased load PMOS 308-312 may be implemented using selected devices from a standard cell library (not shown) having both earlier designed larger devices and later designed smaller devices. Further to the one aspect, devices selected from such a standard cell library may include devices concurrently having a longer channel, hence a larger L for Equation (7), and a higher body effect coefficient and hence a larger γ for Equation (6). From such devices may be selected the longer channel self-body biased load PMOS 308-312. In one example according to the one aspect, an STJ memory (not shown) having portions such as the FIG. 3 example environment 300 can be implemented with earlier designed PMOS IO devices (not explicitly shown) for the longer channel self-body biased load PMOS 308-312, while using later designed, smaller core devices elsewhere. As will be appreciated by persons of ordinary skill in the art, this aspect, by using a larger, higher body effect device, such as the described IO device, for the longer channel self-body biased load PMOS 308-312, obtains with a larger γ an increased sensing margin by maximizing the body effect (see, for example, Equation (6)) and hence lower $V_{TH}$ during a read operation, and obtains a further increase in processing yield by minimizing (see Equation (7)) the sensing margin variation.

Figure 4:
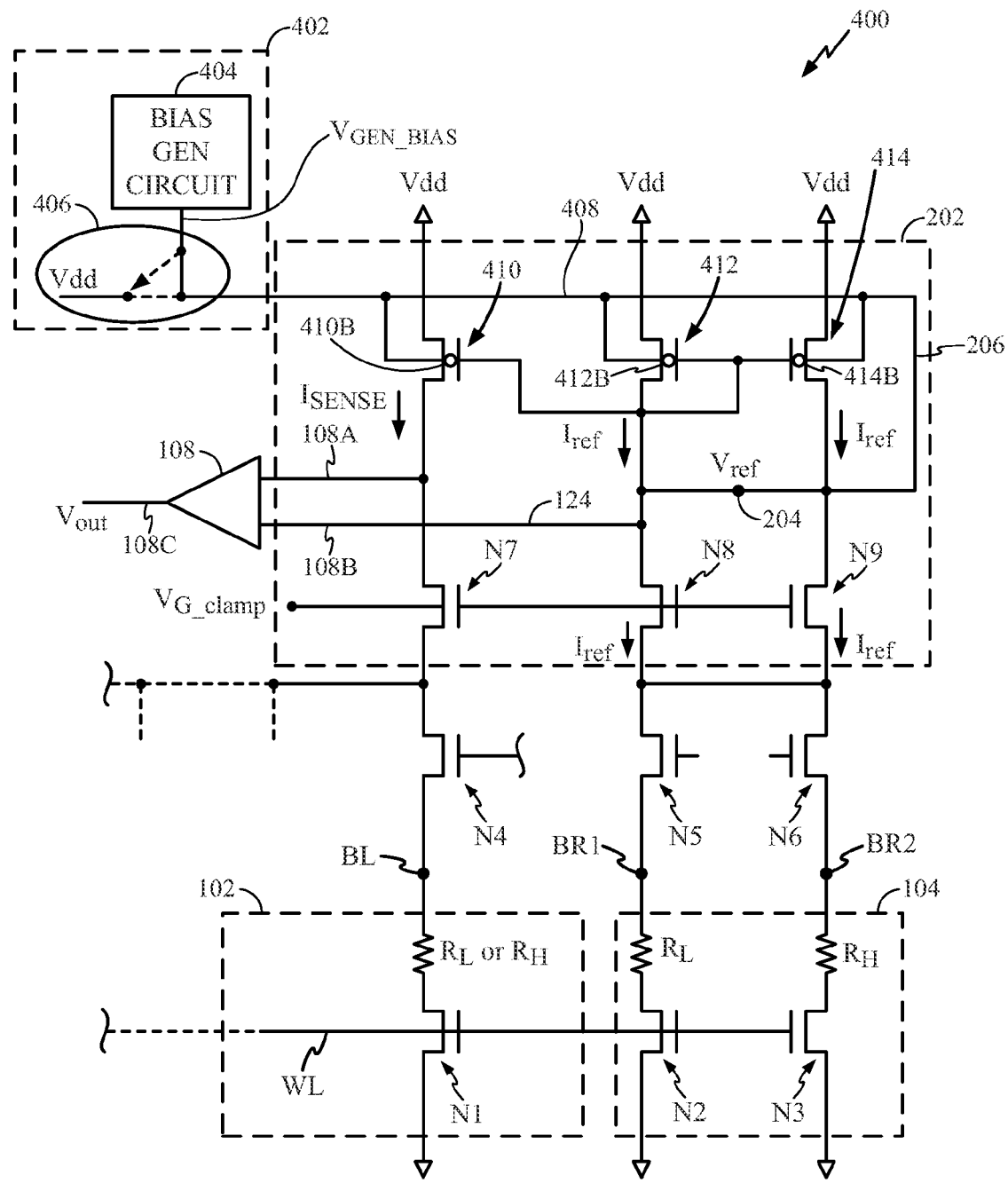
FIG. 4 shows a schematic diagram of one example switched-mode generator biased sensing circuit according to one exemplary embodiment.

FIG. 4 shows a schematic diagram of one example switched-mode generator biased sensing circuit 402 according to one exemplary embodiment, in an example STJ memory environment 400 that may be identical to the STJ environment 200 of FIG. 2.

Referring to FIG. 4, the example switched-mode generator biased sensing circuit 402 includes a bias voltage generator 404, a bias switch 406, and a bias distribution element 408, for example one or more metal traces, coupled to the body 410B of the sense current control PMOS transistor (hereinafter referred to as "sense load PMOS") 410, and to the body 412B and 414B of reference load PMOS 412 and 414, respectively. The bias voltage generator outputs bias voltage $V_{GEN\_BIAS}$, which is lower than Vdd. In one aspect, during a stand-by mode the bias switch 406 couples Vdd to the bias distribution element, which establishes a $V_{SB}$ of 0 volts for the sense load PMOS 410, and for the reference load PMOS 412 and 414 (collectively referenced as "PMOS load devices 410-414"). The threshold voltage of each of these PMOS load devices 410-414 is then at $V_{TH0}$. Further to the one aspect, during a read or sense mode the bias switch 406 couples $V_{GEN\_BIAS}$ from the bias voltage generator 404 to the bias distribution element 408, which establishes a $V_{SB}$ of (Vdd–$V_{GEN\_BIAS}$) volts on the PMOS load devices 410-414.

Referring still to FIG. 4, the above-described read mode $V_{SB}$ of (Vdd–$V_{GEN\_BIAS}$) volts on each of the PMOS load devices 410-414 moves their threshold voltage from $V_{TH0}$ to a $V_{TH}$ lower than $V_{TH0}$ in accordance with Equation (6). As will be appreciated by persons of ordinary skill in the art, this obtains some of the increased sensing margin benefit obtained by the FIG. 2 self-body biasing sensing circuit 202 and the FIG. 3 self-body biasing sensing circuit 302. Further, since the bias switch 406 causes the threshold voltage of the PMOS load devices 410-414 to revert to $V_{TH0}$ during stand-by, the switched-mode generator biased sensing circuit 402 obtains some of the reduced stand-by leakage current benefit of the FIG. 2 self-body biasing sensing circuit 202 and the FIG. 3 self-body biasing sensing circuit 302. However, depending on the particular application and environment, finding an optimal $V_{GEN\_BIAS}$ voltage may be more difficult because, unlike the self-body biasing sensing circuit embodiments, the $V_{GEN\_BIAS}$ voltage may not inherently track with processing variation, or temperature variation changing $V_{TH0}$ of the PMOS load devices 410-414.

Figure 5:
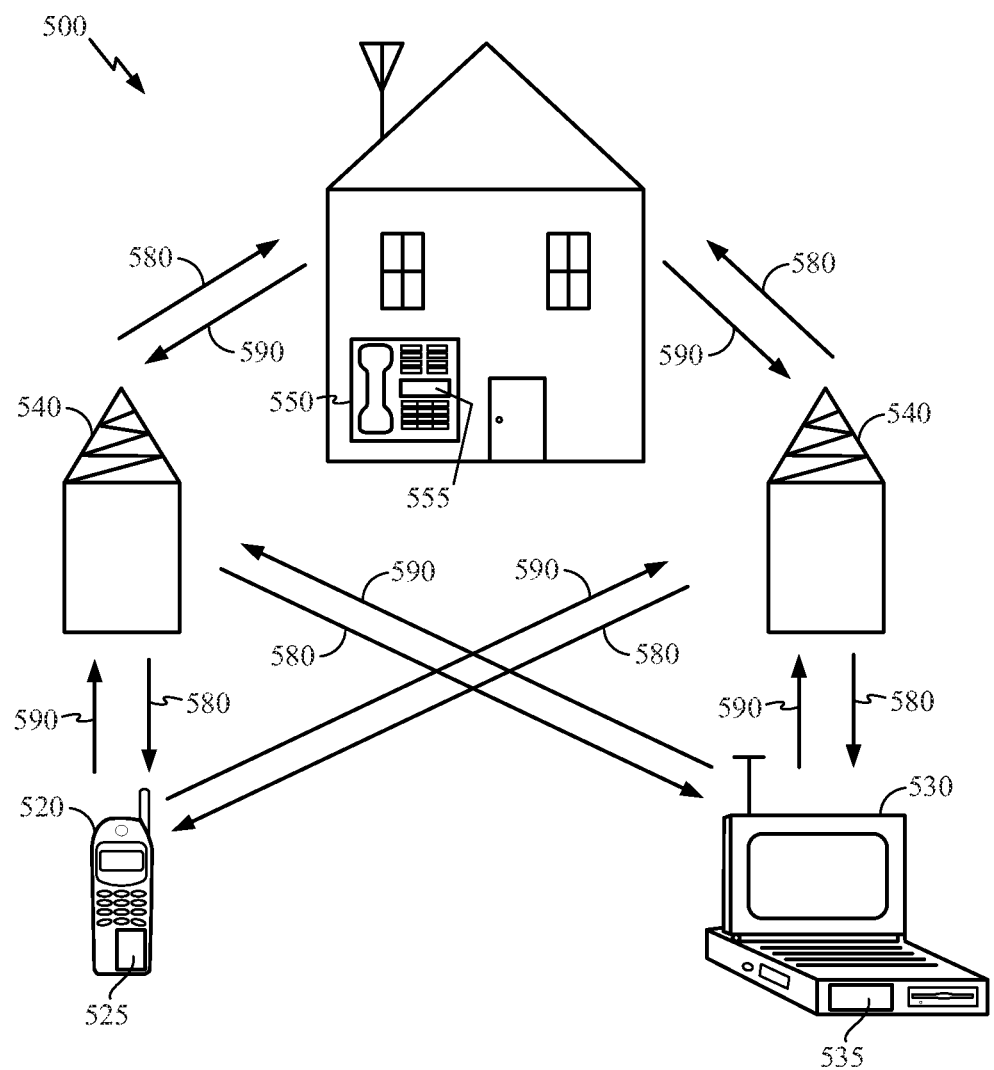
FIG. 5 is a functional block diagram of a system having example devices according to one or more exemplary embodiments.

FIG. 5 illustrates an exemplary wireless communication system 500 in which one or more embodiments of the disclosure may be advantageously employed. For purposes of illustration, the exemplary wireless communication system 500 shows three remote units 520, 530, and 550 and two base stations 540. It will be recognized that conventional wireless communication systems may have many more remote units and base stations. The remote units 520, 530, and 550 can include semiconductor devices 525, 535 and 555, and one or more of the semiconductor devices 525, 535 and 555 can include self-body biased load transistor sensing circuit according to one or more of the exemplary embodiments including, but not limited to, embodiments described in reference to any of FIG. 2, 3 or 4. FIG. 5 shows forward link signals 580 from the base stations 540 and from the remote units 520, 530, and 550 and reverse link signals 590 from the remote units 520, 530, and 550 to the base stations 540.

In FIG. 5, the remote unit 520 is shown as a mobile telephone, the remote unit 530 is shown as a portable computer, and the remote unit 550 is shown as a fixed location remote unit in a wireless local loop system. It will be understood that these are only examples of devices that may implement any of the remote units 520, 530 and 550. For example, the remote units 520, 530 and 550 may be any of a mobile phone, handheld personal communication system (PCS) unit, portable data unit such as personal data assistant (PDA), navigation device (such as GPS enabled device), set top box, music player, video player, or other mobile entertainment unit, or may be a fixed location data unit such as meter reading equipment, or any other device that stores or retrieves data or computer instructions, or any combination thereof. Although FIG. 5 illustrates remote units according to the teachings of the disclosure, the disclosure is not limited to these exemplary illustrated units. Embodiments of the disclosure may be suitably employed in any semiconductor die or other device that includes active integrated circuitry including memory and on-chip circuitry for test and characterization.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A memory read circuit apparatus, comprising:
    a reference node;
    a reference current control transistor having a source coupled to a terminal for receiving a power supply voltage, a drain coupled to the reference node, a body coupled to the drain, and a gate coupled to the reference node; and
    a read current control transistor having a source coupled to a terminal for receiving the power supply voltage, a drain, a body coupled to the drain of the reference current control transistor, and a gate coupled to the reference node.

2. The memory read circuit apparatus of claim 1, wherein, in response to receiving an approximately zero volts body bias voltage between the source and the body of the read current control transistor, the read current control transistor has a threshold voltage $V_{TH0}$.

3. The memory read circuit apparatus of claim 2, further comprising a stand-by mode pre-charge circuit to pre-charge, in response to a stand-by condition, the body of the read current control transistor to have the approximately zero volts body bias voltage.

4. The memory read circuit apparatus of claim 2, wherein the reference current control transistor also has a threshold voltage $V_{TH0}$ in response to receiving an approximately zero volts body bias voltage between the source and the body of the reference current control transistor.

5. The memory read circuit apparatus of claim 4, wherein in response to receiving the power supply voltage at the source of the reference current control transistor concurrent with a reference voltage on the drain of the reference current control transistor, a self-body bias voltage is established between the source and the body of the reference current control transistor and, in response to the self-body bias voltage, the reference current control transistor has a threshold voltage $V_{TH}$, wherein $V_{TH}$ is lower than $V_{TH0}$.

6. The memory read circuit apparatus of claim 5, wherein the power supply voltage is Vdd and the reference voltage is approximately Vdd/2.

7. The memory read circuit apparatus of claim 1, further comprising a switchably enabled reference resistance path from the reference node to a ground wherein, in response to the switchably enabled reference resistance path being enabled concurrent with receiving the power supply voltage at the source of the reference current control transistor, a reference current flows through the reference current control transistor and through the switchably enabled reference resistance path and establishes a reference voltage on the reference node, and the reference voltage establishes a self-body bias voltage between the source and the body of the reference current control transistor.

8. The memory read circuit apparatus of claim 7, wherein the power supply voltage is Vdd and the reference voltage is approximately Vdd/2.

9. The memory read circuit apparatus of claim 8, wherein, in response to receiving an approximately zero volts body bias voltage between the source and the body of the reference current control transistor, the reference current control transistor has a threshold voltage $V_{TH0}$ and wherein, in response to the self-body bias voltage, the reference current control transistor has a threshold voltage $V_{TH}$, wherein $V_{TH}$ is lower than $V_{TH0}$.

10. The memory read circuit apparatus of claim 9, wherein the read current control transistor also has the threshold voltage $V_{TH0}$ in response to receiving an approximately zero volts body bias voltage between the source and the body of the read current control transistor.

11. The memory read circuit apparatus of claim 10, wherein the coupling of the drain of the reference current control transistor to the body of the read current control transistor establishes, in response to the reference voltage on the reference node, a self-body bias voltage between the source and the body of the read current control transistor and wherein, in response to said self-body bias voltage, the read current control transistor has a threshold voltage $V_{TH}$, wherein $V_{TH}$ is lower than $V_{TH0}$.

12. The memory read circuit apparatus of claim 1, wherein, in response to a reference voltage on the reference node, the coupling from the reference node to the gate of the read current control transistor establishes the reference voltage on the gate of the read current control transistor, and the coupling of the drain of the reference current control transistor to the body of the read current control transistor establishes a self-body bias voltage between the source and the body of the read current control transistor, wherein the self-body bias voltage is lower than the reference voltage.

13. The memory read circuit apparatus of claim 12, wherein, in response to the self-body bias voltage between the source and the body of the read current control transistor the read current control transistor has a threshold voltage $V_{TH}$, wherein $V_{TH}$ is lower than $V_{TH0}$.

14. The memory read circuit apparatus of claim 12, wherein, in response to the reference voltage on the reference node, the coupling from the reference node to the gate of the read current control transistor applies the reference voltage to the gate of the read current control transistor, and the coupling from the drain of the reference current control transistor to the body of the read current control transistor applies the self-body bias voltage between the source and the body of the read current control transistor, wherein the self-body bias voltage is lower than the reference voltage.

15. The memory read circuit apparatus of claim 1, wherein the read current control transistor is a first p-channel metal oxide semiconductor field effect (PMOS) transistor and the reference current control transistor is a second PMOS transistor.

16. The memory read circuit apparatus of claim 15, wherein the first PMOS transistor, and the second PMOS transistor each have a given extended channel length.

17. The memory read circuit apparatus of claim 1, wherein the reference current control transistor is a first reference current control transistor, wherein the memory read circuit apparatus further comprises:
a second reference current control transistor having a source coupled to a terminal for receiving a power supply voltage, a drain coupled to the reference node, a body coupled to said drain, and a gate coupled to the reference node.

18. The memory read circuit apparatus of claim 1, wherein the memory read circuit apparatus is integrated in at least one semiconductor die.

19. The memory read circuit apparatus of claim 1, further comprising a device, selected from the group consisting of a set top box, music player, video player, entertainment unit, navigation device, communications device, personal digital assistant (PDA), fixed location data unit, and a computer, into which the apparatus is integrated.

20. A memory read circuit apparatus, comprising:
a reference node;
a reference current control transistor having a source coupled to a terminal for receiving a power supply voltage of Vdd volts, a body, a drain coupled to the reference node, and a gate coupled to the reference node;
a read current control transistor having a source coupled to a terminal for receiving the power supply voltage of Vdd volts, a body, a drain, and a gate coupled to the reference node; and
a body bias voltage generating circuit to convert the power supply voltage of Vdd volts to a body bias voltage and, in response to an operating condition, to couple the body bias voltage to the body of at least one of the read current control transistor or the reference current control transistor.

21. The memory read circuit apparatus of claim 20, further comprising a pre-charge circuit to detect a stand-by condition and, in response, to perform a pre-charging of the body of at least one of the read current control transistor or the reference current control transistor to Vdd.

22. The memory read circuit apparatus of claim 21, wherein the body bias voltage is lower than Vdd.

23. The memory read circuit apparatus of 22, wherein at least one of the read current control transistor or the reference current control transistor has a threshold voltage $V_{TH0}$ in response to the pre-charging.

24. The memory read circuit apparatus of claim 23, wherein, in response to the body bias voltage, at least one of the read current control transistor or the reference current control transistor has a threshold voltage $V_{TH}$, wherein $V_{TH}$ is lower than $V_{TH0}$.

25. The memory read circuit apparatus of claim 20, wherein the body bias voltage generating circuit, in response to the operating condition, lowers a charge on the body of at least one of the reference current control transistor or the read current control transistor to the body bias voltage.

26. The memory read circuit apparatus of claim 20, wherein the apparatus is integrated in at least one semiconductor die.

27. The memory read circuit apparatus of claim 20, further comprising a device, selected from the group consisting of a set top box, music player, video player, entertainment unit, navigation device, communications device, personal digital assistant (PDA), fixed location data unit, and a computer, into which the apparatus is integrated.

28. A method for reading a resistance memory having at least one read current control transistor having a body and at least one reference current control transistor having a body, comprising:
detecting a stand-by condition; and
in response to detecting the stand-by condition, pre-charging at least one of the body of the read current control transistor or the body of the at least one reference current control transistor to a given power supply voltage.

29. The method of claim 28, further comprising:
detecting going off of the stand-by condition to an operating condition; and
in response to said detecting going off of the stand-by condition to an operating condition charging at least one of the body of the read current control transistor or the body of at least one reference current control transistor to a body biasing voltage lower than the given power supply voltage.

30. The method of claim 29, further comprising:
generating a reference voltage, the generating including flowing a reference current from the power supply voltage through the reference current control transistor and through a given reference resistance, wherein the body biasing voltage is the reference voltage.

31. A transistor body biasing apparatus for a resistance memory reading circuit having at least one read current control transistor having a body and at least one reference current control transistor having a body, comprising:
means for detecting a stand-by condition; and
means for pre-charging, in response to detecting the stand-by condition, at least one of the body of the read current control transistor or the body of the at least one reference current transistor to a given power supply voltage.

32. The transistor body biasing apparatus of claim 31, further comprising:
means for detecting going off of the stand-by condition to an operating condition; and
means for charging, in response to said detecting, at least one of the body of the read current control transistor or the body of one the reference current transistors to a body biasing voltage lower than the given power supply voltage.

33. The transistor body biasing apparatus of claim 31, wherein the apparatus is integrated in at least one semiconductor die.

34. The transistor body biasing apparatus of claim 31, further comprising a device, selected from the group consisting of a set top box, music player, video player, entertainment unit, navigation device, communications device, personal digital assistant (PDA), fixed location data unit, and a computer, into which the apparatus is integrated.

35. A method for reading a resistance memory having at least one read current control transistor having a body and at least one reference current control transistor having a body, comprising:
step of detecting a stand-by condition; and
step of pre-charging, in response to a result of the step of detecting the stand-by condition, at least one of the body of the read current control transistor or the body of the at least one reference current transistor to a given power supply voltage.

36. The method of claim 35, further comprising:
step of detecting going off of the stand-by condition to an operating condition; and
step of charging, in response to a result of said step of detecting going off of the stand-by condition to an operating condition, at least one of the body of the read current control transistor or the body of the at least one reference current transistor to a body biasing voltage lower than the given power supply voltage.

37. The method of claim 36, further comprising:
step of generating a reference voltage, the generating including flowing a reference current from the power supply voltage through the reference current control transistor and through a given reference resistance, wherein the body biasing voltage is the reference voltage.

* * * * *